United States Patent
Roy et al.

(10) Patent No.: US 8,531,567 B2
(45) Date of Patent: Sep. 10, 2013

(54) IMAGE SENSOR WITH VERTICAL TRANSFER GATE

(75) Inventors: François Roy, Seyssins (FR); Frédéric Barbier, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 271 days.

(21) Appl. No.: 12/910,176

(22) Filed: Oct. 22, 2010

(65) Prior Publication Data
US 2011/0096208 A1 Apr. 28, 2011

(30) Foreign Application Priority Data
Oct. 22, 2009 (FR) ..................................... 09 57427

(51) Int. Cl.
*H04N 3/14* (2006.01)
*H04N 5/335* (2011.01)

(52) U.S. Cl.
USPC .......................................... 348/308; 348/296

(58) Field of Classification Search
USPC ...... 348/294, 296, 302, 308, 332; 250/208.1; 257/330, 652; 438/157, 211, 257
See application file for complete search history.

(56) References Cited

U.S. PATENT DOCUMENTS

| | | | | |
|---|---|---|---|---|
| 4,477,835 A * | 10/1984 | Berger et al. | ................. | 348/324 |
| 6,545,302 B2 * | 4/2003 | Han | ................. | 257/222 |
| 6,657,665 B1 * | 12/2003 | Guidash | ................. | 348/308 |
| 7,492,027 B2 * | 2/2009 | Mouli | ............... | 257/446 |
| 8,310,003 B2 * | 11/2012 | Kohyama | ................. | 257/330 |
| 2006/0081887 A1 | 4/2006 | Lyu | | |
| 2006/0124976 A1 | 6/2006 | Adkisson et al. | | |
| 2006/0256221 A1 | 11/2006 | Mckee et al. | | |
| 2006/0274176 A1 | 12/2006 | Guidash | | |
| 2007/0184614 A1 * | 8/2007 | Adkisson et al. | ............. | 438/259 |
| 2008/0303930 A1 * | 12/2008 | Kuroda et al. | ................ | 348/308 |
| 2009/0266973 A1 | 10/2009 | Roy et al. | | |
| 2009/0303371 A1 | 12/2009 | Watanabe et al. | | |
| 2011/0089311 A1 * | 4/2011 | Venezia et al. | ............. | 250/208.1 |

OTHER PUBLICATIONS

French Search Report from corresponding French Application No. 09/57427.

* cited by examiner

*Primary Examiner* — Aung S Moe
*Assistant Examiner* — Chriss Yoder, III
(74) *Attorney, Agent, or Firm* — Wolf, Greenfield & Sacks, P.C.

(57) ABSTRACT

An image sensor including a first pixel positioned between second and third pixels, each of the first, second and third pixels comprising a photodiode region surrounded by an isolation trench; a first charge transfer gate comprising a first column electrode surrounded by an insulating layer and positioned in an opening of the isolation trench between the first and second pixels, the first column electrode being configured to receive a first transfer voltage signal; and a second charge transfer gate including a second column electrode surrounded by an insulating layer and positioned in an opening of the isolation trench between the first and third pixels, the second column electrode being configured to receive a second transfer voltage signal.

26 Claims, 5 Drawing Sheets

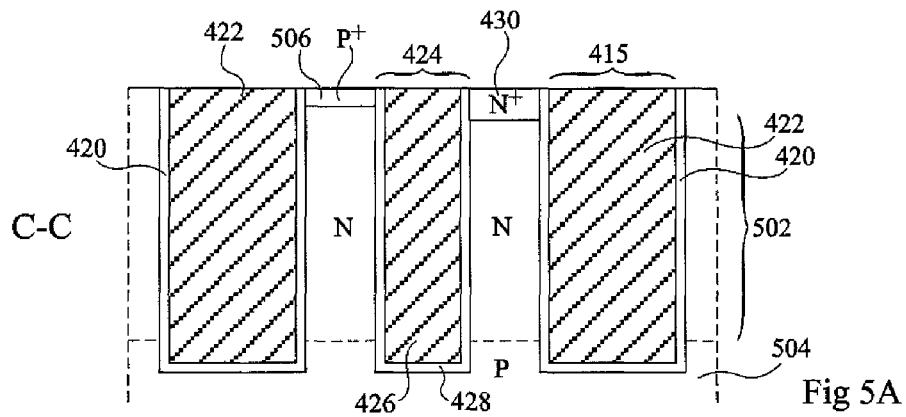
Fig 5A
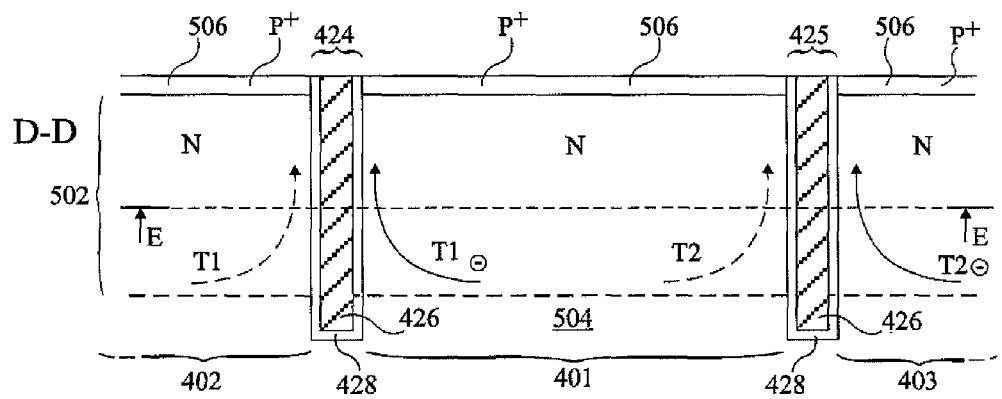
Fig 5B
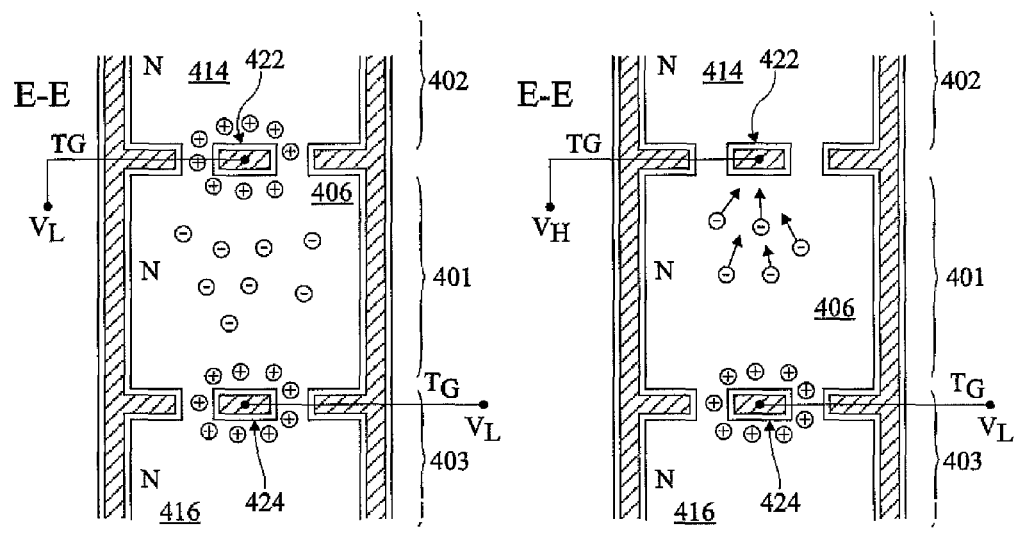
Fig 5C
Fig 5D

IMAGE SENSOR WITH VERTICAL TRANSFER GATE

CROSS REFERENCE TO RELATED APPLICATIONS

This application claims the priority benefit of French patent application number 09/57427, filed on Oct. 22, 2009, entitled "Image Sensor With Vertical Transfer Gate," which is hereby incorporated by reference to the maximum extent allowable by law.

BACKGROUND OF THE INVENTION

1. Field of the Invention

The present invention relates to an image sensor, and in particular to an image sensor comprising pixels having a vertical transfer gate.

2. Discussion of the Related Art

Monolithic image sensors comprise photodiodes and transistors formed in a silicon substrate. More specifically, such image sensors comprise an array of pixels each having a photodiode coupled to a sense node via a transfer transistor. A charge accumulated by the photodiode during an integration period can be transferred to the sense node via the transfer transistor.

FIG. 1 illustrates a pixel 100 of an image sensor formed in a P-type substrate 102. A photodiode of the pixel comprises a heavily-doped P-type layer (P+) 104 formed over an N-type well 106, formed in the P-type substrate. A transfer transistor comprises a gate stack 108 formed on the surface of the P-substrate 102 on one side of the photodiode. A drain 110 is formed of a heavily-doped N-type region, and is coupled to a sense node SN. Charges accumulated by the photodiode during an integration phase can be transferred to the sense node by applying a voltage signal to the gate electrode of the transfer transistor.

The pixel 100 is insulated from adjacent pixels on each side by shallow trench isolation (STI) regions 112, 114. A spacing 116 can be provided between the STI 112 and the N-type well of the photodiode to provide electrical continuity between the surface P+ layer 104 and the P-type substrate 102, and reduce the risk of dark current generation in the photodiode.

To increase the sensitivity of the image sensor and/or reduce its size, it would be desirable to increase the surface area and depth of the N well 106. However, there are problems in increasing the size of N well 106 without limiting the charge that is transferred and/or without increasing the overall size of the image sensor.

SUMMARY OF THE INVENTION

It is one aim of embodiments of the present invention to at least partially address one or more problems in the prior art.

According to one aspect of the present invention, there is provided an image sensor comprising: a first pixel positioned between second and third pixels, each of the first, second and third pixels comprising a photodiode region surrounded by an isolation trench; a first charge transfer gate comprising a first column electrode surrounded by an insulating layer and positioned in an opening of the isolation trench between the first and second pixels, the first column electrode being configured to receive a first transfer voltage signal; and a second charge transfer gate comprising a second column electrode surrounded by an insulating layer and positioned in an opening of the isolation trench between the first and third pixels, the second column electrode being configured to receive a second transfer voltage signal.

According to one embodiment, the image sensor further comprises: a first charge collection node associated with said first charge transfer gate for collecting charge stored in the photodiode regions of the first and second pixels; and a second charge collection node associated with said second charge transfer gate for collecting charge stored in the photodiode regions of the first and third pixels.

According to another embodiment, at least a portion of the isolation trench of the first pixel is common to the first and second pixels.

According to another embodiment, the opening between the first and second pixels is formed in a common section of said isolation trench between the first and second pixels.

According to another embodiment, the image sensor further comprises a control block configured to apply, during a read phase of the image sensor, the first transfer voltage signal to the first column electrode to transfer charge stored by said first and second pixels to said first charge collection node prior to applying said second transfer voltage signal to the second column electrode to transfer charge stored by said first and third pixels to said second charge collection node.

According to another embodiment, the image sensor further comprises a further charge transfer gate comprising a further column electrode insulated from second photodiode region by an insulating layer and positioned in an opening between the second pixel and a charge collection region, the further column electrode being configured to receive a further transfer voltage.

According to another embodiment, the photodiode regions of the first, second and third pixels comprise a heavily doped P-type layer formed over an N-type region.

According to another embodiment, the isolation trenches of the first, second and third pixels are filled with a conductive material.

According to another embodiment, the trenches of the first, second and third pixels and the first and second charge transfer gates have a depth of between 1 and 10 μm.

According to another embodiment, the first and second charge collection nodes are each coupled to a common sense node of pixel control circuitry arranged to read a voltage level associated with said first and second photodiode regions.

According to another embodiment, the image sensor comprises an array of said first, second and third pixels.

According to another aspect of the present invention, there is provided an electronic image capturing device comprising the above image sensor.

According to another aspect of the present invention, there is provided a method of manufacturing an image sensor comprising an array of pixels, the method comprising: forming a first pixel between second and third pixels, each of the first, second and third pixels comprising a photodiode region surrounded by an isolation trench; forming a first charge transfer gate comprising a first column electrode surrounded by an insulating layer and positioned in an opening of the isolation trench between the first and second pixels, the first column electrode being configured to receive a first transfer voltage signal; and forming a second charge transfer gate comprising a second column electrode surrounded by an insulating layer and positioned in an opening of the isolation trench between the first and third pixels, the second column electrode being configured to receive a second transfer voltage signal.

According to another embodiment, the method further comprises forming a first charge collection node associated with said first charge transfer gate for collecting charge stored in the photodiode regions of the first and second pixels; and forming a second charge collection node associated with said second charge transfer gate for collecting charge stored in the photodiode regions of the first and third pixels.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIGS. 5A and 5B are cross-sections of the pixel of FIG. 4;
FIGS. 5C and 5D are planar views of the pixel of FIG. 4.

DETAILED DESCRIPTION

Figure 1:
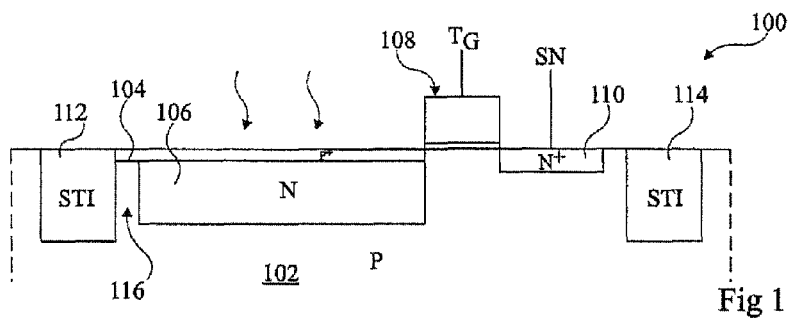
FIG. 1 (described above) is a cross-section view of a pixel.
Figure 2:
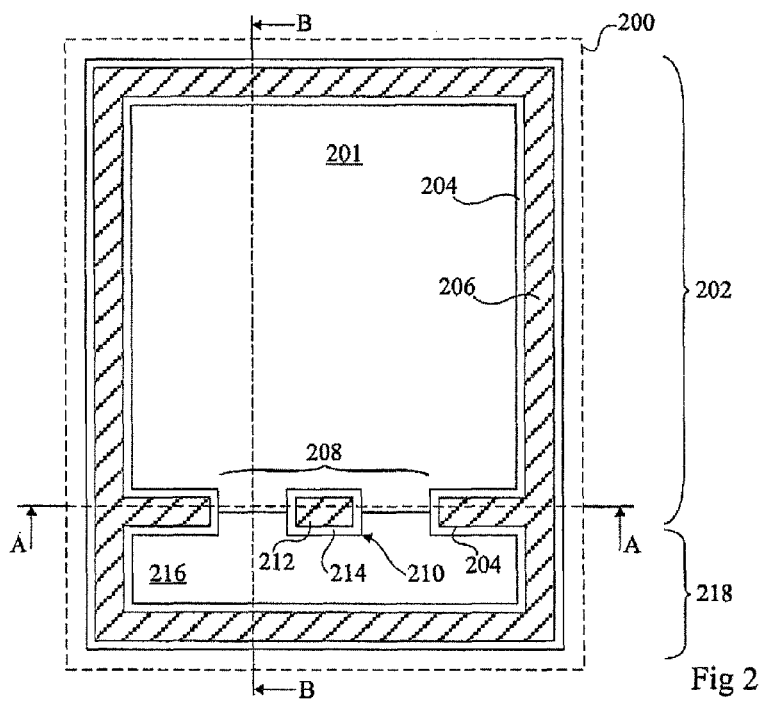
FIG. 2 is a plan view of a pixel according to an embodiment.

FIG. 2 is a plan view of a pixel 200 that has been proposed by the present applicant in French patent application FR 08/52759 and in U.S. patent application Ser. No. 12/429,413, which are hereby incorporated by reference to the maximum extent allowable by the law.

The pixel 200 comprises a rectangular photodiode region 201, which is, for example, around 1 µm square, surrounded by a rectangular trench 202. Trench 202 comprises an insulating layer 204, and a conducting core 206 formed of a conducting material.

There is an opening 208 on one side of the rectangular trench. A charge transfer gate 210 is positioned approximately halfway across the opening 208, and comprises a rectangular column, for example having the same thickness as the trench 202. The column 210 comprises a conductive core 212 forming a gate electrode surrounded by an insulating layer 214 forming a gate insulation. The opening 208 leads to a charge collection region 216, which is surrounded by a rectangular extension 218 of the trench 202.

Figure 3A:
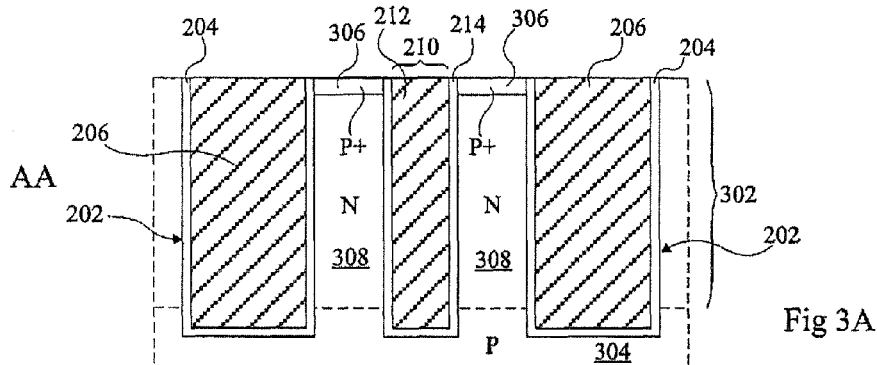
FIGS. 3A and 3B are cross-sections of the pixel of FIG. 2.

FIG. 3A illustrates the cross-section A-A of the pixel of FIG. 2, passing through the side of the rectangular trench 202 with opening 208 and column 210. The pixel is formed of an N-type layer 302, for example between 1 and 8 µm in depth, positioned over a P-type substrate 304. The trench 202, for example, extends to the same depth as the column 210, which is, for example, in the range 1 to 10 µm. The column 210 and/or trench 202, for example, extend a short way into the P-type substrate. In the photodiode region 201, a heavily doped P-type (P+) layer 306 is formed over the N-type layer 302, forming an N-type well 308.

Figure 3B:
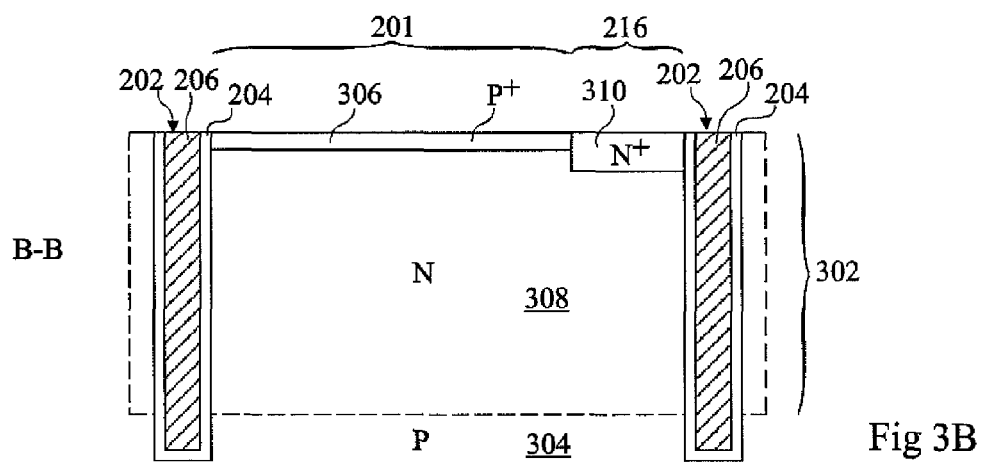

FIG. 3B illustrates the cross-section B-B of the pixel of FIG. 2, which is perpendicular to cross-section A-A, and a passes through the opening 208 on one side of the column 210. As illustrated, the N-type layer 302 is continuous from the region 201 to the region 216 through the opening 208, but within region 216, a heavily doped N-type layer (N+) 310 is formed over the N-well 308 having, for example, a depth greater than that of the P+ layer 306. For example, P+ layer 306 has a depth of around 0.1 µm and N+ layer 310 has a depth of around 0.3 µm.

One drawback of the pixel of FIG. 2 is that the charge collection region 216 does not form part of the photodiode region of the device, and thus limits the percentage of each pixel that can be used for charge collection and storage.

Figure 4:
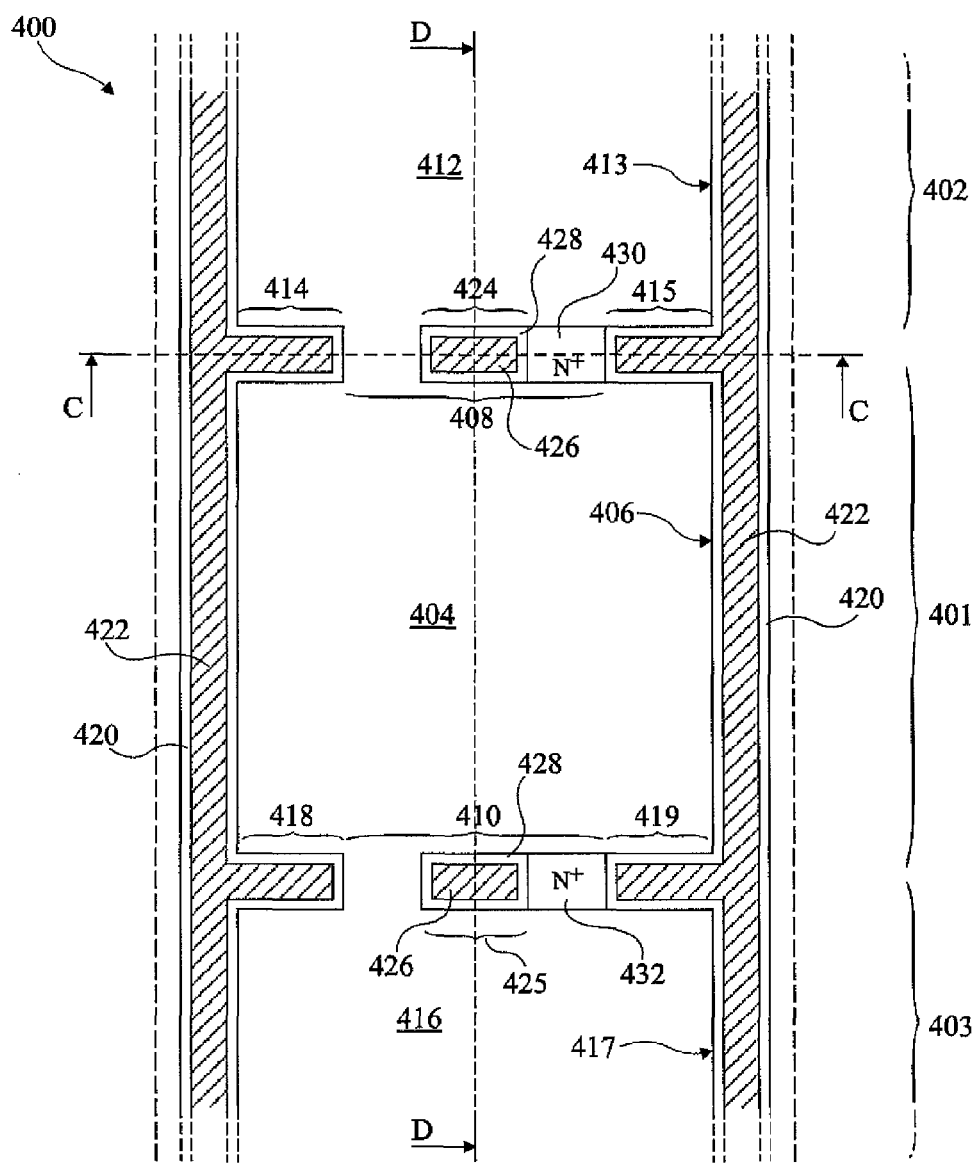
FIG. 4 is a plan view of a pixel according to an embodiment of the present invention.

FIG. 4 illustrates a portion 400 of an image sensor comprising a pixel 401, and portions of further pixels 402 and 403 positioned adjacently on opposite sides of pixel 401. Pixel 401 comprises a photodiode region 404 surrounded by a rectangular trench 406, having openings 408 and 410 formed on opposite sides. Opening 408 is common to the trenches 406 and 413, and leads from the photodiode region 404 to a photodiode region 412 of the adjacent pixel 402. The photodiode region 412 is also surrounded by a rectangular trench 413, of which portions 414 and 415 on either side of opening 408 are common to the rectangular trench 406. In particular, the rectangular trenches 406 and 413 share a common side in which the opening 408 is formed. Opening 410 is common to the trenches 406 and 417, and leads from the photodiode region 404 to a photodiode region 416 of the adjacent pixel 403. The photodiode region 416 is also surrounded by a rectangular trench 417, of which portions 418 and 419 on either side of opening 410 are common to the rectangular trench 406. In particular, rectangular trenches 406 and 417 share a common side in which the opening 410 is formed.

The trenches 406, 413 and 417 are active DTIs (deep trench isolations) comprising an insulating layer 420, and a conductive core 422 formed of a conducting material. The insulating layer 420 electrically insulates the conducting core 422 from the surrounding silicon.

For example, the insulating layer 420 is formed of silicon oxide, silicon nitride, silicon oxynitride, or a multi-layer structure comprising any combination of these materials, and has a thickness in the range 5 to 15 nm, for example around 7 nm. The conductive material 422 is polysilicon having, for example a dopant concentration greater than $10^{19}$ at./cm$^3$. The trenches 406, 413 and 417 are, for example, between 0.1 and 0.5 µm in thickness, and between 1 and 10 µm in depth. In alternative embodiments, trenches 406, 413 and 417 could be non-active DTIs, comprising only an insulating material, for example one of the insulating materials of layer 420 listed above.

Within each opening 408, 410, a respective column 424, 425 is formed having a width in the range 0.1 and 0.4 µm, for example around 0.3 µm, and a thickness approximately equal to that of trenches 406, 413, 417. Columns 424, 425 are similar to column 210 of FIG. 2, and form charge transfer gates having a conducting core 426 surrounded by and insulated from the silicon of the photodiode regions by an insulating layer 428. The conducting core 426 and insulating layer 428 are, for example, formed of the same materials as the conductive core 422 and insulating layer 420 of the trenches 406, 413, 417, and form gate electrodes and gate insulations respectively of the charge transfer gates 424, 425.

The openings 408 and 410 have, for example, widths of between one quarter and three quarters of the length of the sides within which they are formed. For example, assuming that trenches 406, 413 and 417 each form a rectangle around 1 µm square, the widths of openings 408 and 410 are, for example, between 0.25 and 0.75 µm, such as around 0.5 µm.

Alternatively, the openings 408, 410 could extend across the whole width, the portions 414, 415, 418 and 419 being removed. In this case, the width of columns 424, 425 could be between 50 and 90 percent of the width of the openings 408, 410. The columns 424, 425 could also have other shapes. For example, they could be formed to have the shape of a "T", the shape of a "+", or the shape of an "H".

Whereas the pixel 200 of FIG. 2 comprises a charge collection region 216 surrounded by a trench, in the structure of FIG. 4, charge collection nodes 430 and 432 are formed of relatively small areas of heavily doped N-type (N+) material positioned within the openings 408, 410 respectively, on one side of each of the columns 424, 425. These nodes effectively form drains of the transfer transistors implemented by the charge transfer gates 424, 425. For example, at least one side of the charge collection nodes 430, 432 contacts the exterior surface of columns 424, 425 respectively, to help provide a good passage for current flow between the photodiode regions and the charge collection nodes.

FIG. 5A shows a cross-section C-C of the structure of FIG. 4, passing along the boundary between the two pixels 401 and 402, and passing through the column 424. The structure shown by this cross-section C-C is similar to the structure shown by cross-section A-A of pixel 200, and comprises a layer 502 of N-type silicon formed by, for example, epitaxy, on a P-type substrate 504. A heavily doped P-type layer 506 is formed over the N-type layer 502 within the photodiode regions 404, 412 and 416. The N-type layer 502 has, for example, a dopant concentration of between $10^{15}$ at./cm$^3$ and $10^{17}$ at./cm$^3$, and the P+ layer 506 for example has a doping concentration greater than $10^{18}$ at./cm$^3$.

Additionally, the N+ region 430 is shown formed over the N-type layer 502 in the gap between the column 424 and the trench portion 415. The charge collection node 430 contacts, for example, the insulating layers 420, 428 on either side.

The columns 424 and 425 and trenches 406, 413 and 417 extend through the whole depth of the N-type layer 502 and also, for example, extend between 0.1 and 2 μm into the substrate 504. Alternatively, the trenches 406, 413, 417 and columns 424, 425 do not penetrate into the substrate 504.

Operation of the image sensor of FIG. 4 will now be described with reference to FIGS. 5B, 5C and 5D.

FIG. 5B shows a cross-section D-D of the structure of FIG. 4, passing perpendicular to cross-section C-C, and traversing the two columns 424 and 425. In this view, the N-type layer 502 formed over the P-type substrate 504 is illustrated, along with the P+ layer 506.

FIGS. 5C and 5D both show a cross-section E-E of FIG. 5B traversing the N-type layer 502, and thus providing horizontal planar views of the pixel N-wells.

In order to control charge accumulation in the photodiodes and charge transfer to the charge collection nodes, a transfer voltage TG is applied to the conductive cores 426 of the columns 422, 424. Furthermore, a low biasing voltage is, for example, applied to the conductive core 422 of the trenches 406, 413 and 417. For example, this polarizing voltage has a constant low level during the integration phase and during the read phase at the end of the integration phase.

With reference to FIG. 5C, during an integration phase, TG is at a low voltage $V_L$, for example between 0 and −1 V. This results in an accumulation of holes around the columns. Light penetrating the photodiode region 406 during the integration phase results in an accumulation of electrons in the N-type wells of the photodiodes. These electrons are effectively trapped, and will not move through the openings 408, 410 to the adjacent N-wells due to the holes accumulated around the columns 424, 425.

As shown in FIG. 5D, at the end of the integration phase of pixel 401, the accumulated charges are transferred by applying a high voltage $V_H$, for example of between 1 and 3 V, to the column 424, while keeping the column 425 at the low voltage $V_L$. This sequence is shown in FIG. 5B. During transfer T1, electrons in the N-well of pixel 401 are conducted via a channel created by column 424 to the charge collection node 430 (not shown in FIG. 5B). The charge of pixel 402 is, for example, transferred first, such that when the transfer T1 is performed via column 424 to empty pixel 401, very little or no charge is transferred from the N-well of pixel 402, as represented by the dashed arrow T1. Likewise, when a subsequent transfer is performed for pixel 403, little or no charge is transferred from pixel 401, as the N-well of pixel 401 has already been emptied.

Figure 6:
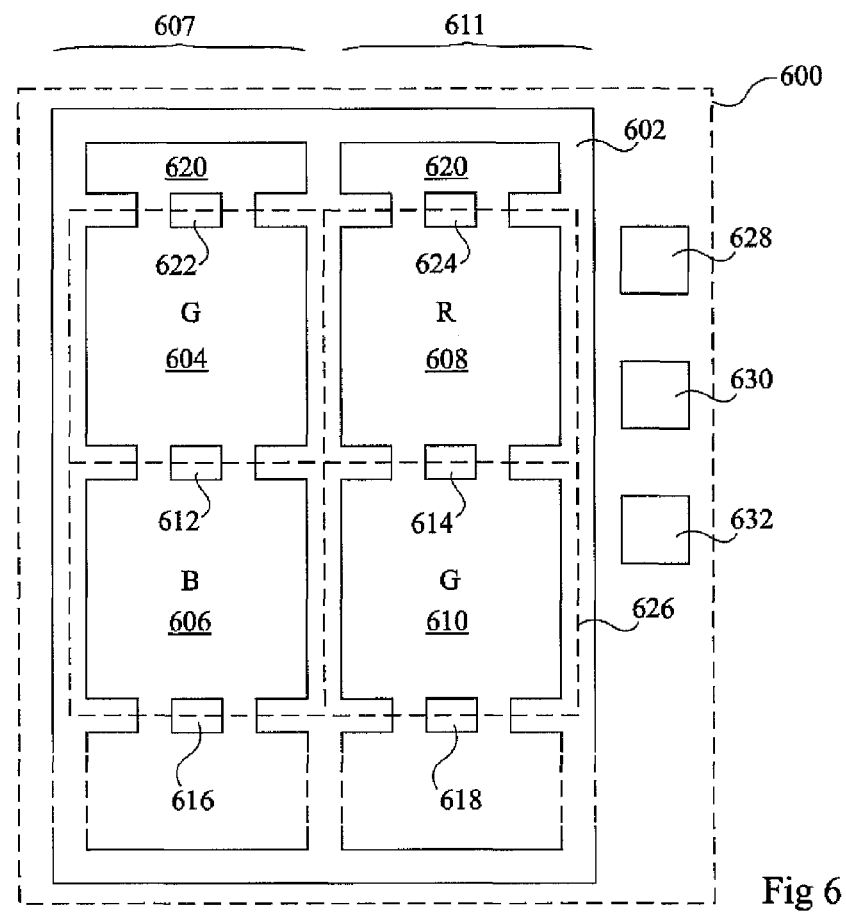
FIG. 6 is a plan view of a portion of an image sensor according to an embodiment of the present invention.

FIG. 6 illustrates a portion 600 of an image sensor comprising a grid 602 of rectangular trenches surrounding photodiode regions of pixels formed in columns. Four pixels are shown, two of which, 604, 606, are arranged in a column 607, and another two of which, 608, 610, are arranged in an adjacent column 611. Within each column, adjacent pixels share charge transfer gates positioned in openings communicating between them. For example, a charge transfer gate 612 is positioned between pixels 604 and 606, a charge transfer gate 614 is positioned between pixels 608 and 610, and charge transfer gates 616 and 618 are positioned between pixels 606, 610 and the subsequent pixels of the respective columns (not illustrated in FIG. 6). The charge transfer gates 612, 614, 616 and 618 are the same as gates 424 and 425 described above.

Pixels 604 and 608 are the first pixels of their respective columns, and a charge collection region 620 is formed adjacent to each of these pixels, similar to the charge collection region 216 of the pixel 200 of FIG. 2. The regions 620 communicate with the photodiode regions of pixels 604, 608 via respective openings, in which charge transfer gates 622, 624 are formed, each being similar to column 210 of FIG. 2. The charge transfer gates 622, 624 and corresponding charge collection regions 620 allow only the charge present in pixels 604 and 608 to be transferred, these pixels being the first to be emptied at the start of a transfer phase of the image sensor.

The end of the final pixel of each column has no charge transfer gate, these final pixels only sharing a charge transfer gate with one adjacent pixel. While not illustrated in FIG. 6, there may be hundreds or thousands of pixels in each column 607, 611. Furthermore, the image sensor may comprise hundreds or thousands of columns similar to columns 607, 611.

A Bayer filter is for example positioned over the image sensor of FIG. 6, part of which is represented by dashed line 626. The pixels 604 and 610 are, for example, associated with green filters, such that they capture green light, while the pixels 606 and 608 are, for example, associated with blue and red filters respectively, such that they capture blue and red light. The four pixels 604 to 610 together form, for example, a particular pattern separating the colors of the image sensor.

A reset transistor 628, source follower transistor 630 and read transistor 632 are formed in the image sensor adjacent to column 611, and perform, for example, the function of reading voltages from pixels 604, 606, 608 and 610, as will now be described with reference to FIG. 7.

Figure 7:
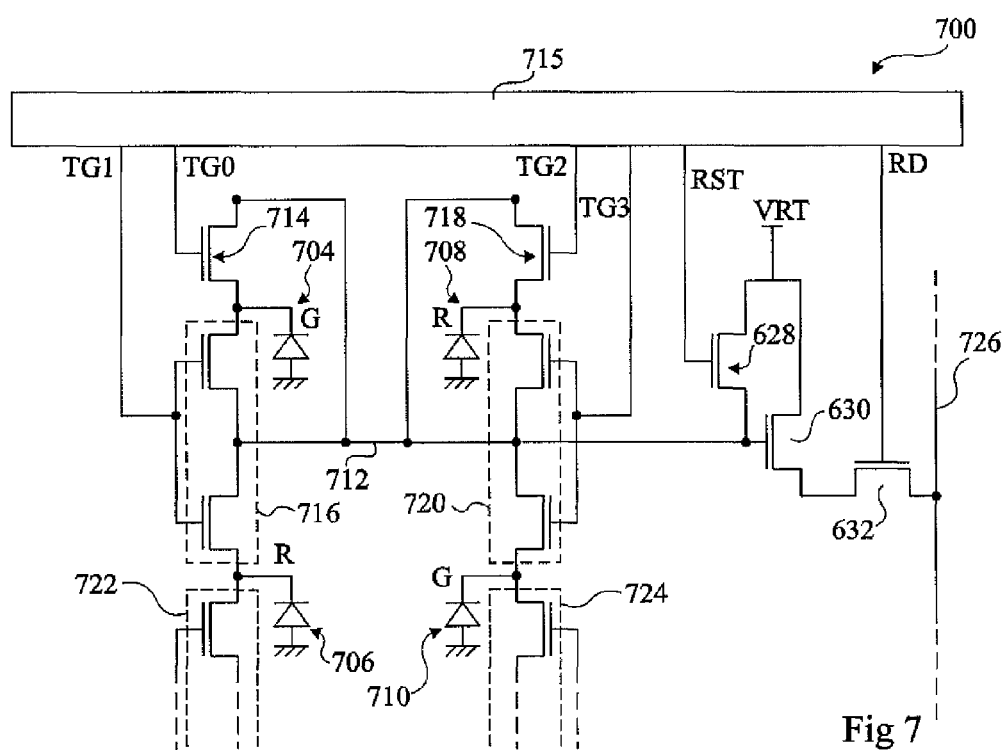
FIG. 7 illustrates schematically a pixel circuit according to an embodiment of the present invention.

FIG. 7 illustrates schematically a pixel circuit 700 for reading the four pixels 604 to 610 of FIG. 6.

The circuit 700 comprises photodiodes 704, 706, 708 and 710 corresponding to the photodiode regions of pixels 604, 606, 608 and 610 respectively. Each of the photodiodes 704 to 710 has its anode coupled to ground, and its cathode coupled a sense node 712 via a pair of transistors implemented by the charge transfer gates between the pixels.

In particular, a transistor 714 corresponds to the charge transfer gate 622 of FIG. 6, and the gate node of transistor 714, which corresponds to the conductive core of the charge transfer gate 622, is coupled to a control block 715 for receiving a transfer voltage signal TG0. Furthermore, a pair of transistors 716 corresponds to the charge transfer gate 612 of FIG. 6, one of the pair coupling photodiode 704 to the sense node 712, and the other coupling the photodiode 706 to the sense node 712. The gate nodes of transistors 716 receive the transfer voltage signal TG1 from the control block 715.

In a similar fashion, a transistor 718 corresponds to the charge transfer gate 624 of FIG. 6, and the gate node of transistor 718 is coupled to the control block 715 for receiving a transfer voltage signal TG2. Furthermore, a pair of transistors 720 corresponds to the charge transfer gate 614 of FIG. 6, one of the pair coupling photodiode 708 to the sense node 712, and the other coupling the photodiode 710 to the sense node 712. The gate nodes of transistors 720 receive the transfer voltage signal TG3 from the control block 715.

Further transistors 722, 724 correspond to the charge transfer gates 616, 618 of FIG. 6 respectively coupling a respective photodiode 706, 710 to the sense node of a separate pixel circuit (not shown in FIG. 7). Transistors 722, 724 are only activated once the charge from photodiodes 706, 710 has been transferred to sense node 712.

The sense node 712 is coupled to the gate node of the source follower transistor 630, which has its source coupled to a read column line 726 via the read transistor 632, and its drain node coupled to a voltage supply VRT. The gate node of the read transistor 632 is coupled to receive a read voltage RD from the control circuitry 715. The sense node 712 is also coupled to the voltage supply VRT via the reset transistor 628, which receives at its gate node a reset signal RST.

While the circuit of FIG. 7 applies to four pixels sharing a same sense node and arranged in a 2 by 2 block, such as the pixels 604, 606, 608 and 610 of FIG. 6, the circuit could be adapted to a 1 by 4 or a 4 by 1 arrangement of pixels sharing a common sense node arranged in a column or row.

Operation of the circuit of FIG. 7 will now be described with reference to the timing diagrams of FIG. 8.

Initially the transfer voltage signals TG0 to TG3 are all high and the reset voltage RST is also high, such that the photodiodes are emptied of charge and thus reset.

To start the integration periods of the pixels, the transfer voltage signals TG0 to TG3 are then brought low one after the other, thus isolating the corresponding photodiodes from the sense node 712. Shortly after the signal TG0 is brought low, the reset signal is also brought low. The transfer voltage TG0 is then brought high for a short period, and a second read is made of the sense node, to read a second reference voltage, and thus determine the charge offset occurring due to a read. The transfer gate voltage TG0 is then brought low again, starting integration period $t_i$ of the photodiode 704.

The same sequence is then used to start the integration periods of each of the other photodiodes 706, 708 and 710 in turn.

The transfer and read phase of the photodiode is implemented as follows.

At the end of the integration period $t_i$ of the photodiode 704, the read signal RD is brought high, the reset signal RST is brought low, and the transfer voltage TG0 is brought high for a short period, such that the charge is transferred from the photodiode 704 to the sense node SN. As shown by the signal CDS (correlated double sampling), a read is performed shortly before TG0 goes high, and shortly after TG0 goes low again, the difference between the voltages read indicating the voltage drop resulting from charge accumulated during the integration period. In particular, the levels before and after the charge is transferred to the sense node are stored in two sampling capacitors, and then a digital or analogue subtraction is applied to the stored signals in order to determine the signal without dispersions resulting from differences in the threshold voltage $V_t$, and in kTC noise, where k is Boltzmann's constant, T is temperature, and C is the capacitance. The voltage at the sense node is then reset by applying the reset signal RST, which is brought low again prior to reading the voltage at the photodiode 706. The reading sequence continues in this fashion for the other photodiodes.

Figure 8:
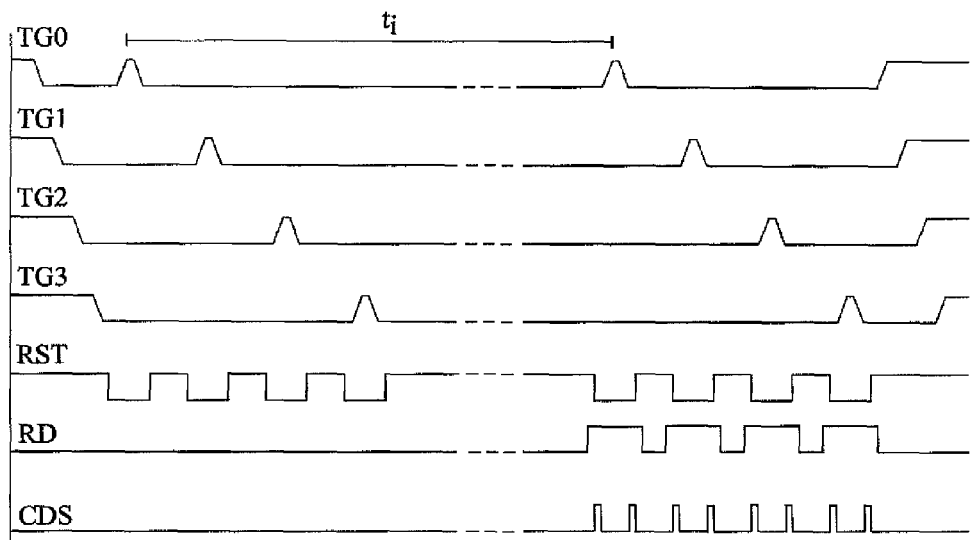
FIG. 8 shows timing signals applied to the circuit of FIG. 7 according to an embodiment of the present invention.

The sequence shown in FIG. 8 corresponds to the read sequence of one group of pixels coupled to a common sense node of a pixel circuit. This sequence is, for example, repeated for all of the pixel circuits of the image sensor in turn, operation being that of a rolling shutter.

While the circuit of FIG. 7 is of a 1T75 type (four charge transfer gates and three other transistors, and four photodiodes), the pixels described herein could be used equally in other pixel circuit types, such as 1T5, 2T, 2T5 or 4T circuits. In the case of a 4T architecture, a single diode is connected to the sense node of a read system comprising three transistors such as the transistors 628, 630 and 632 of FIG. 7.

Figure 9:
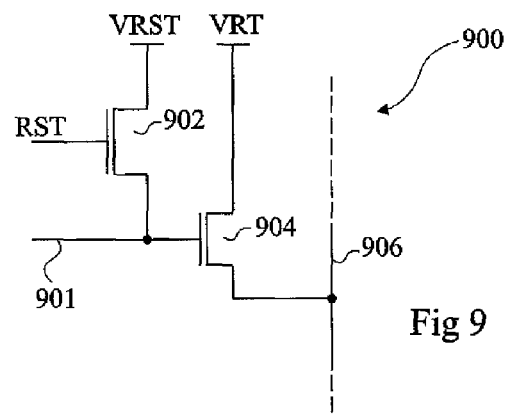
FIG. 9 illustrates schematically a portion of a pixel circuit according to an alternative embodiment of the present invention.

FIG. 9 illustrates read circuitry 900 of a pixel circuit corresponding, for example, to a 2T pixel circuit type. The sense node 901 is, for example, coupled to two of the pixels as described above.

In read circuitry 900, sense node 901 is coupled to a reset voltage VRST by a reset transistor 902, and to the gate node of a sense transistor 904, which is coupled between a further supply voltage VRT and a column read line 906. In this circuit, the read is performed by applying the voltage VRST during a reset, and subsequently transferring a photodiode charge to the sense node 901, which can then be read on line 906.

Figure 10:
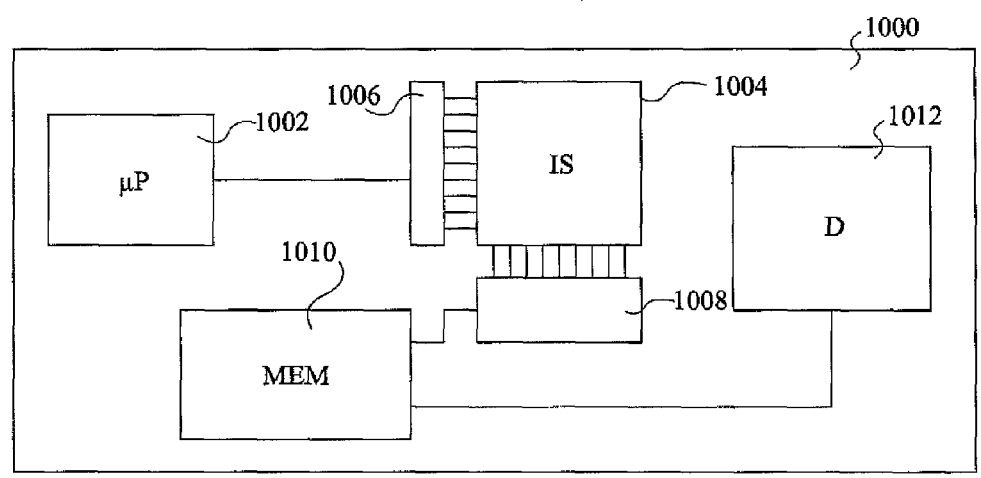
FIG. 10 illustrates an electronic device comprising an image sensor according to embodiments of the present invention.

FIG. 10 illustrates an electronic device 1000, comprising a microprocessor 1002, and an image sensor 1004 comprising, for example, an array of the pixels as described herein, and associated with a control circuit 1006, which generates the signals RST, TG and RD for controlling the pixel circuits of the image sensor. Read circuitry 1008 is also coupled to the image sensor, for example comprising switches and capacitors for sampling and storing voltage values read from the column read lines of the image sensor 1004. A memory 1010 for example stores images captured by the image sensor, and a display 1012 for example displays captured images.

The electronic device 1000 is, for example, a digital still and/or video camera, mobile device or portable games console having image capturing capabilities, a webcam, laptop computer or other digital image capturing device having an image sensor adapted to capture still images and/or video.

An advantage of the embodiments described herein is that the pixels have a high percentage of their area performing the function of a photodiode, and a relatively small percentage of their area performing the function of the transfer transistor. Thus the image sensor can have a greater sensitivity and/or occupy less chip area.

While the present invention has been described in relation to a number of specific embodiments, it will be apparent to those skilled in the art that various alterations and modifications could be applied.

For example, although one example layout has been described in FIG. 6, and a corresponding circuit schematic is illustrated in FIG. 7, there are other possible arrangements. For example, rather than being formed in columns, the pixels could be formed in rows, with charge transfer columns positioned between pixels of the same row. Furthermore, the charge transfer columns could have shapes other than those described above, for example extending across the whole width of the pixel and even integrating a portion of the adjacent sides.

Furthermore, each pixel circuit could be coupled to a different group of pixels than the group shown in FIG. 6.

Furthermore, while examples have been described in which each pixel is surrounded by an active DTI, in alternative embodiments the DTI could be non-active, for example formed only of an insulating layer.

Such alterations, modifications, and improvements are intended to be part of this disclosure, and are intended to be within the spirit and scope of the invention. Accordingly, the foregoing description is by way of example only and is not intended as limiting. The present invention is limited only as defined in the following claims and the equivalents thereto.

What is claimed is:

1. An image sensor comprising:
   a first pixel positioned between second and third pixels, each of the first, second and third pixels comprising a photodiode region surrounded by an isolation trench;
   a first charge transfer gate comprising a first column electrode surrounded by an insulating layer and positioned in an opening of the isolation trench between the first and second pixels, the first column electrode being configured to receive a first transfer voltage signal; and
   a second charge transfer gate comprising a second column electrode surrounded by an insulating layer and positioned in an opening of the isolation trench between the first and third pixels, the second column electrode being configured to receive a second transfer voltage signal, wherein the first charge transfer gate and the second charge transfer gate extend into a substrate located under the photodiode region.

2. The image sensor of claim 1 comprising:
   a first charge collection node associated with said first charge transfer gate for collecting charge stored in the photodiode regions of the first and second pixels; and
   a second charge collection node associated with said second charge transfer gate for collecting charge stored in the photodiode regions of the first and third pixels.

3. The image sensor of claim 2, further comprising a control block configured to apply, during a read phase of the image sensor, the first transfer voltage signal to the first column electrode to transfer charge stored by said first and second pixels to said first charge collection node prior to applying said second transfer voltage signal to the second column electrode to transfer charge stored by said first and third pixels to said second charge collection node.

4. The image sensor of claim 2, wherein said first and second charge collection nodes are each coupled to a common sense node of pixel control circuitry arranged to read a voltage level associated with said first and second photodiode regions.

5. The image sensor of claim 1, wherein at least a portion of the isolation trench of the first pixel is common to the first and second pixels.

6. The image sensor of claim 1, wherein said opening between the first and second pixels is formed in a common section of said isolation trench between said first and second pixels.

7. The image sensor of claim 1, further comprising a further charge transfer gate comprising a further column electrode insulated from second photodiode region by an insulating layer and positioned in an opening between the second pixel and of a charge collection region, the further column electrode being configured to receive a further transfer voltage.

8. The image sensor of claim 1, wherein said photodiode regions of the first, second and third pixels comprise a heavily doped P-type layer formed over an N-type region.

9. The image sensor of claim 1, wherein said isolation trenches of the first, second and third pixels are filled with a conductive material.

10. The image sensor of claim 1, wherein said trenches of the first, second and third pixels and the first and second charge transfer gates have a depth of between 1 and 10 μm.

11. The image sensor of claim 1, comprising an array of said first, second and third pixels.

12. An electronic image capturing device comprising the image sensor of claim 1.

13. An image sensor comprising:
    first, second and third pixels formed on a substrate, wherein the first pixel is positioned between the second and third pixels and wherein each of the first, second and third pixels comprises a photodiode region surrounded by an isolation trench;
    a first transfer gate positioned in a first opening of the isolation trench between the first and second pixels, the first transfer gate configured to receive a first control signal; and
    a second transfer gate positioned in a second opening of the isolation trench between the first and third pixels, the second transfer gate configured to receive a second control signal, wherein the first and second transfer gates extend into the substrate.

14. An image sensor as defined in claim 13, wherein the isolation trenches of the first and second pixels share a common side in which the first opening is formed and wherein the isolation trenches of the first and third pixels share a common side in which the second opening is formed.

15. An image sensor as defined in claim 14, wherein the first and second transfer gates each comprise a conductive core, which forms a gate electrode, and an insulating layer surrounding the conductive core, which forms a gate insulator.

16. An image sensor as defined in claim 13, wherein each isolation trench comprises an insulating layer and a conductive core.

17. An image sensor as defined in claim 13, further comprising first and second charge collection nodes respectively positioned in the first and second openings on one side of each of the first and second transfer gates.

18. An image sensor as defined in claim 13, wherein each photodiode region comprises an N-type layer formed on a P-type substrate and a heavily-doped P-type layer formed over the N-type layer.

19. An image sensor as defined in claim 13, wherein the first, second and third pixels are arranged in a column of the image sensor.

20. An image sensor as defined in claim 13, further comprising a controller configured to apply charge accumulation voltages to the first and second transfer gates during an integration phase and to apply charge transfer voltages to the first and second transfer gates during a read phase.

21. An image sensor comprising:
    an array of pixels arranged in rows and columns, each column including:
    first, second and third pixels formed on a substrate, wherein the first pixel is positioned between the second and third pixels and wherein each of the first, second and third pixels comprises a photodiode region surrounded by an isolation trench;

a first transfer gate positioned in a first opening of the isolation trench between the first and second pixels, the first transfer gate configured to receive a first control signal; and a second transfer gate positioned in a second opening of the isolation trench between the first and third pixels, the second transfer gate configured to receive a second control signal, wherein the first and second transfer gates extend into the substrate;

a controller configured to supply the first and second control signals to the first and second transfer gates, respectively, during integration and read phases; and a read circuit configured to sample and store voltages representative of charge values accumulated by the first, second and third pixels during the integration phase and transferred during the read phase.

22. An image sensor as defined in claim 21, wherein the isolation trenches of the first and second pixels share a common side in which the first opening is formed and wherein the isolation trenches of the first and third pixels share a common side in which the second opening is formed.

23. An image sensor as defined in claim 22, wherein the first and second transfer gates each comprise a conductive core, which forms a gate electrode, and an insulating layer surrounding the conductive core, which forms a gate insulator.

24. An image sensor as defined in claim 21, further comprising first and second nodes respectively positioned in the first and second openings on one side of each of the first and second transfer gates.

25. An image sensor as defined in claim 21, wherein the first, second and third pixels are arranged in one of the columns of the image sensor.

26. An image sensor as defined in claim 21, wherein the first, second and third pixels are arranged in one of the rows of the image sensor.

* * * * *